US012666981B1

(12) United States Patent
Wang et al.

(10) Patent No.: US 12,666,981 B1
(45) Date of Patent: Jun. 23, 2026

(54) STRESS-REDUCED PACKAGE SUBSTRATE AND METHOD OF FORMING THE SAME

(71) Applicant: XILINX, INC., San Jose, CA (US)

(72) Inventors: Huayan Wang, Campbell, CA (US); Seungbae Park, Vestal, NY (US); Gamal Refai-Ahmed, Santa Clara, CA (US); Suresh Ramalingam, Fremont, CA (US); Jaspreet Singh Gandhi, San Jose, CA (US); Yu Hsiang Sun, Hsin Chu (TW); Scott Mccann, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 268 days.

(21) Appl. No.: 17/142,926

(22) Filed: Jan. 6, 2021

(51) Int. Cl.
H10W 70/65 (2026.01)
H10W 70/05 (2026.01)
H10W 70/685 (2026.01)

(52) U.S. Cl.
CPC .......... H10W 70/65 (2026.01); H10W 70/05 (2026.01); H10W 70/685 (2026.01)

(58) Field of Classification Search
CPC .......... H01L 23/49838; H01L 21/4857; H01L 23/49822; H10W 70/65; H10W 70/05; H10W 70/685
See application file for complete search history.

(56) References Cited

U.S. PATENT DOCUMENTS

| | | | | |
|---|---|---|---|---|
| 9,496,193 B1 * | 11/2016 | Roesner | .................. | H01L 24/32 |
| 2008/0006900 A1 * | 1/2008 | Chan | .................... | H10D 62/117 |
| | | | | 257/E23.125 |
| 2008/0012096 A1 * | 1/2008 | Sin | ........................ | B23K 26/382 |
| | | | | 257/E23.179 |
| 2010/0122838 A1 * | 5/2010 | Asami | .................. | H05K 1/0203 |
| | | | | 174/255 |
| 2015/0179616 A1 * | 6/2015 | Lin | ...................... | H01L 23/3121 |
| | | | | 257/773 |
| 2016/0071779 A1 * | 3/2016 | Chen | .................. | H01L 23/5389 |
| | | | | 257/787 |
| 2019/0159332 A1 * | 5/2019 | Ishibashi | ................ | H05K 1/021 |
| 2019/0304804 A1 * | 10/2019 | Imayoshi | ............. | H05K 3/0052 |
| 2021/0098352 A1 * | 4/2021 | Sir | .................... | H01L 23/49827 |
| 2021/0305123 A1 * | 9/2021 | Yu | ......................... | H01L 23/145 |

* cited by examiner

*Primary Examiner* — Benjamin Tzu-Hung Liu
(74) *Attorney, Agent, or Firm* — Patterson + Sheridan, LLP

(57) ABSTRACT

Disclosed herein is a package substrate and a method for fabricating the same. In one example, a package substrate includes a core having an outer edge and a first plurality of first interconnect layers disposed on the core. The first plurality of interconnect layers disposed on the core include an outermost dielectric layer disposed farthest from the core. The outermost dielectric layer has an edge that is recessed from the edge of the core.

20 Claims, 7 Drawing Sheets

STRESS-REDUCED PACKAGE SUBSTRATE AND METHOD OF FORMING THE SAME

BACKGROUND

Field of Endeavor

Examples described herein generally relate to an improved package substrate and methods for fabricating the same.

Description of the Related Art

A package substrate is used to connect one or more integrated circuits (IC) dice of a chip package to a printed circuit board (PCB). The package substrate electrically and mechanically couples the IC dice to the PCB through plural contact pads, wiring, and solder bumps. The package substrate generally includes a core sandwiched between interconnect layers. The interconnect layers are fabricated from multiple patterned metal and dielectric layers to form trace wiring (e.g., conductive routing) through the package substrate in order to send and receive data, ground and power signals between the IC dice and the PCB.

As the size of patterned electronic devices increase, conventional approaches to maintaining the integrity and reducing warpage of large package substrates (e.g., 50 mm×50 mm and above) include the selection of core materials having low coefficients of thermal expansion (CTE). Typical low CTE core materials include layers of woven glass fabric held together by resin. As low CTE cores have a higher percentage of fiber glass, the CTE mismatch between the glass (low CTE) and resin (high CTE) is significant, which increases the risk of cracking when cores of low CTE are cut to form individual substrates. Additionally, the interconnect layers generally have a CTE that is much higher than that of the core. The CTE mismatch between the interconnect layers and the core, particularly on large package substrates, can result in peeling of one or more of the interconnect layers, causing damage to the wiring routed through the package substrate. Thus, simply lowering the core CTE has not proven to be a robust solution.

Accordingly, there is a need for an improved package substrate and method for manufacturing the same.

SUMMARY

Disclosed herein is a package substrate and a method for fabricating the same. In one example, a package substrate includes a core having an outer edge and a first plurality of first interconnect layers disposed on the core. The first plurality of interconnect layers disposed on the core include an outermost dielectric layer disposed farthest from the core. The outermost dielectric layer has an edge that is recessed from the edge of the core.

In another example, an integrated circuit device is provided. The integrated circuit device includes an IC die having solid state circuitry and a package substrate. The package substrate includes a core having an outer edge and a first plurality of first interconnect layers disposed on the core. The first plurality of interconnect layers disposed on the core include an outermost dielectric layer disposed farthest from the core and having the IC die communicatively and mechanically coupled thereto. The outermost dielectric layer has an edge that is recessed from the edge of the core.

In another example, a method for fabricating a package substrate is provided. The method includes forming an arc-shaped slot through a panel, and dicing the panel along a first scribe lane and a second scribe lane. The first scribe lane and the second scribe lane intersecting the slot.

BRIEF DESCRIPTION OF THE DRAWING

So that the above recited features of the present disclosure can be understood in detail, a more particular description of the disclosure, briefly summarized above, may be had by reference to examples herein, some of which are illustrated in the appended drawings. However, it is to be noted that the appended drawings illustrate only examples and are therefore not to be considered limiting of the disclosure's scope. Accordingly, the appending drawings admit to other equally effective examples.

In order to facilitate understanding, identical reference numerals have been used, where possible, to designate identical elements that are common features. It is contemplated that elements and features of one example may be beneficially incorporated into other examples without further recitation.

DETAILED DESCRIPTION

Examples disclosed herein generally relate an improved package substrate and methods for fabricating the same. The package substrate includes a core sandwiched between interconnect layers. At least a portion of the outermost layer of the interconnect layers is recessed from the edge or projected edge of the core, which reduces the stress between the interconnect layers and the core, thus reducing the probability of peeling or delamination of the interconnect layers from the core. Additionally, the corner of the core is fabricated in a manner that reduces stress within the core, thus reducing the probability of the core cracking and damaging the package substrate. The projected edge of the core is the laterally outward edges of the core extended to meet at a 90 degree corner in embodiments where the actual adjacent edges of the core do not intersect at right angles. The outermost interconnect layer is the interconnect layer of the package substrate that is furthest from the core. Since at least a portion of the outermost interconnect layer is recesses from the core, the adverse stress generated by CTE mismatch is moderated, resulting in a more robust structure and particularly a core that is less prone to cracking. As a result, the reliability of the wiring routed through the package substrate is significantly increased.

The interconnect layer may be beneficial recessed from the core in a number of techniques and configuration, any one of which proving a significant improvement over the state of the art non-recessed package substrate (e.g., a package substrate having essentially vertical edges such that the planar area of the interconnect layer and the core are the same). As mentioned above, in one example the outermost layer of the interconnect layers is recessed from the edge of the core. The outermost layer of the interconnect layers may be recessed from the edge of the core on one or both sides of the core. The outermost layer(s) may be recessed from the (projected or actual) edge of the core along any one, multiple or all of the edges or corners of the package substrate. For example, an edge of the outermost layer of the interconnect layers may be recessed from where two projected edges of the core intersect (i.e., at the corner of the package substrate). In another example, an edge of the outermost layer of the interconnect layers may be recessed from a vertical edge of the core that is not in a corner region of the package substrate. Recessing of the outermost layer of the interconnect layers from the core beneficially reduces stress and propensity of the interconnect layer(s) from peeling. Additionally, the manner in which the corner is configured also beneficially reduces the propensity of the core to crack, which beneficially enhances robust and reliable performance of the package substrate within chip packages and electronic devices.

Figure 1:
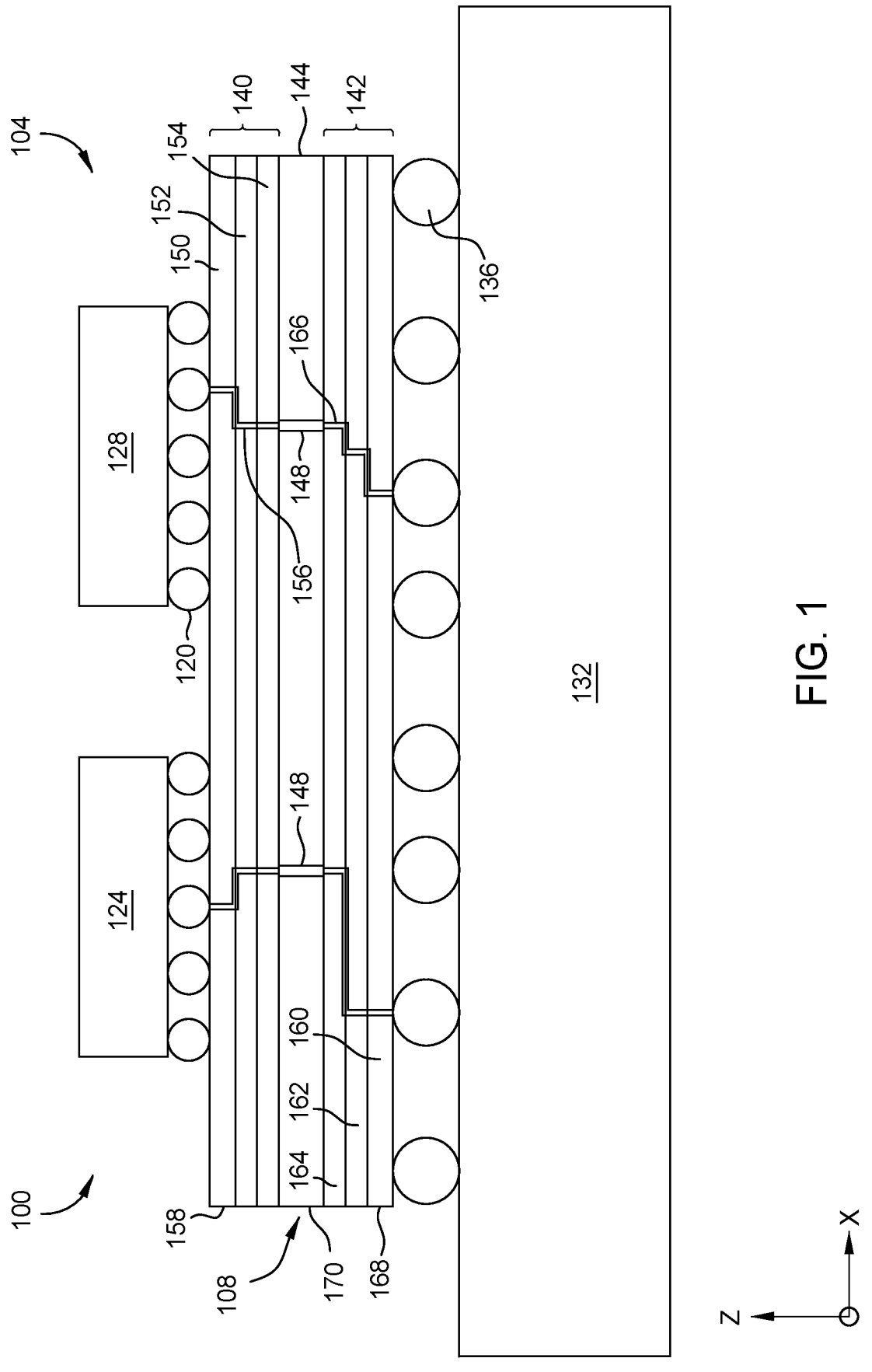
FIG. 1 illustrates a plan view of an exemplary electronic device having a package substrate.

Turning now to FIG. 1, a plan view of an exemplary electronic device 100 having a package substrate 108 is illustrated. The electronic device 100 includes an integrated circuit (IC) chip package 104 coupled to a printed circuit board (PCB) 132, in a vertical direction (i.e., a z-direction). The electronic device 100 may be a computer, tablet, cell phone, smart phone, consumer appliance, control system, automated teller machine, programmable logic controller, printer, copier, digital camera, television, monitor, stereo, radio, radar, or other device incorporating the chip package 104.

The chip package 104 includes at least one integrated circuit (IC) die mounted to the package substrate 108. In FIG. 1, an IC die 124 and an IC die 128 are shown communicatively and mechanically coupled to the package substrate 108 by of micro-bumps 120. One or more of the IC dice 124, 128 may alternatively be optically coupled to the package substrate 108. The micro-bumps 120 electrically connect the circuitry of each IC die 124, 128 to the circuitry of the package substrate 108. Although IC dice 124, 128 are illustrated in FIG. 1, the chip package 104 may include only one or more than 2 IC dice. The chip package 104 may also have an overmold (not shown) covering the IC dice 124, 128 and the package substrate 108. Optionally, an interposer (not shown) may be utilized to couple the IC dice 124, 128 to circuitry of the package substrate 108.

The package substrate 108 may be mounted and connected to the PCB 132 utilizing solder connections, wire bonding or other suitable technique. In the embodiment depicted in FIG. 1, the package substrate 108 is mounted to the PCB 132 using a plurality of solder balls 136. As illustrated, the package substrate 108 and the PCB 132 are disposed in an x-y plane. Optionally, PCB 132 may additionally or alternatively be optically coupled to the package substrate 108.

The IC dice 124, 128 may be programmable logic devices, such as field programmable gate arrays (FPGA), memory devices, optical devices, processors or other IC logic structures. Exemplary optical logic devices include photo-detectors, lasers, optical sources, and the like.

The package substrate 108 includes a first plurality of interconnect layers 140, a second plurality of interconnect layers 142, and a core 144. The core 144 is sandwiched between the first and second interconnect layers 140, 142. Optionally, only a single plurality of interconnect layers 140 is disposed between the core 144 and the IC dice 124, 128, with the core 144 being mounted directly to the PCB 132.

The first plurality of interconnect layers 140 includes 3 or more metal layers disposed between dielectric layers 150, 152, 154. The metal layers are patterned to form conductive routing 156 through the dielectric layers 150, 152, 154 that enable power, ground and data signals to be transmitted through the first plurality of interconnect layers 140 of the package substrate 108. Only a portion of the conductive routing 156 is shown in FIG. 1 for simplicity. The dielectric layer 150 defines the outermost metalization layer of the first plurality of interconnect layers 140 which is disposed farther from the core 144. In one example, the dielectric layer 150 is a solder mask material, such as a thin lacquer-like or epoxy polymer layer. The patterned metal layers forming the conductive routing 156 may be fabricated from copper, aluminum or other suitable electrical conductor.

Similarly, the second plurality of interconnect layers 142 includes 3 or more metal layers disposed between dielectric layers 160, 162, 164. The metal layers are patterned to form conductive routing 166 through the dielectric layers 160, 162, 164 that enable power, ground and data signals to be transmitted through the first plurality of interconnect layers 142 of the package substrate 108. The dielectric layer 160 defines the outermost metalization layer of the first plurality of interconnect layers 142 which is disposed farther from the core 144. In one example, the dielectric layer 160 is a solder mask material, such as a thin lacquer-like or epoxy polymer layer. The patterned metal layers forming the conductive routing 166 may be fabricated from copper, aluminum or other suitable electrical conductor.

The core 144 is formed from a rigid dielectric material, such as silicon, glass reinforced plastic, ceramic or other suitable material. The core 144 include a plurality of conductive vias 148 that couple the routings 156, 166 so that power, ground and data signals to be transmitted through the package substrate 108 between IC dice 124, 128 and the PCB 132.

Optionally, at least some or all the vias 148 and routings 156, 166 may be configured as waveguides. In such embodiments, the waveguides (i.e., vias 148, and routings 156, 166) enable light signals to be transmitted through the package substrate 108 between one or more of the IC dice 124, 128 and the PCB 132. In other embodiments, some of the vias 148, and routings 156, 166) are configured as waveguides while others are configured as electrical conductors, so that the package substrate 108 can transmit both light and electrical signals between one or more of the IC dice 124, 128 and the PCB 132. As used herein, "communicatively" referred to an interface between the package substrate and one or both of the IC die and PCB that allows the transmission of light and/or electrical signals therebetween.

The core 144 generally has an outer edge 170. At least a portion of an outer edge 158 of the outermost dielectric layer of the first plurality of interconnect layers 140 is recessed from the outer edge 170 of the core 144 along at least one portion of the package substrate 108. Recessed meaning closer to the center of the package substrate 108.

At least a portion of an outer edge 168 of the outermost dielectric layer of the second plurality of interconnect layers 142 is recessed from the outer edge 170 of the core 144 along at least one portion of the package substrate 108. Although the recess of the edges 158, 168, and the edge 170 is not apparent in FIG. 1, the recess between the edges 158, 168, 170 is better illustrated in FIGS. 3-6, among others.

Figure 2:
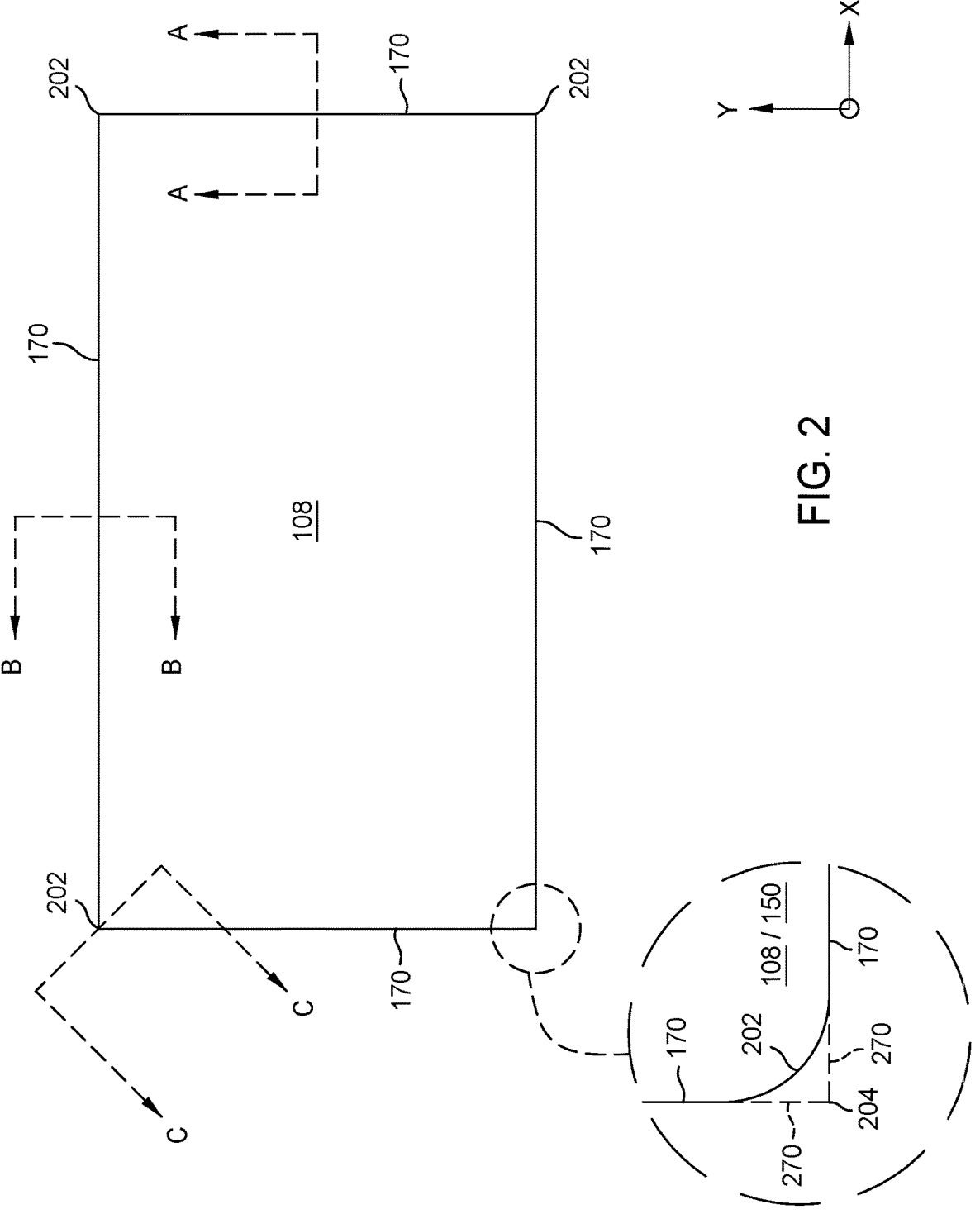
FIG. 2 is a top view of the package substrate of FIG. 1.

FIG. 2 is a top view of the package substrate 108. As the package substrate 108 is generally rectangular, the adjacent outer edges 170 of the core 144 generally meet to form 90 degree corners 202, which the exception in some embodiments as further described below. The outer edges 170 of the core 144 also defined the outer edges, and thus planar extents (in the x/y plane) of the package substrate 108. In optional embodiments wherein the corners 202 of the package substrate 108 are chamfered, rounded or otherwise to not meet to form 90 degree corners, the adjacent outer edges 170 can be projected as shown by dashed lines illustrating projected outer edges 270. The projected outer edges 270 are collinear with the outer edges 170 and intersect at 90 degree projected corners 204. As illustrated in the enlarged portion of FIG. 2, the projected corners 204 are generally outward of the actual corners 202 when the corners 202 of the package substrate 108 are chamfered, rounded or otherwise recessed inward (in the x and/or y direction) of the projected outer edges 270.

As discuss above, the recess of the outer edges 158, 168 of the outermost dielectric layers 150, 160 and the outer edge 170 (and/or projected outer edge 270) beneficially reduces stress within the dielectric layers 150, 160 that correspondingly reduces the likelihood of peeling or delamination of the layers 140, 142. Furthermore, the reduction in stress collectively applied by the interconnect layers 140, 142 to the core 144 significantly reduces the risk of the core 144 to cracking, thus enhancing the reliability and performance of the package substrate 108. The recess is present along at least one or more locations along the periphery of the package substrate 108. One example of a recess 210 between the outer edges 158, 168 of the dielectric layers 150, 160 and the projected outer edge 270 of the core 144 is illustrated in the enlarged portion of FIG. 2 showing the corner 202 disposed inward of the projected corner 204.

Figure 2B:
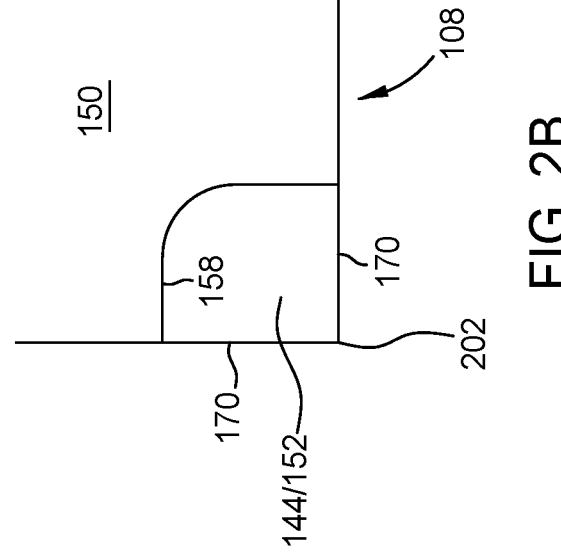
FIGS. 2A-2B are alternative details of a top view of a corner of the package substrate of FIG. 2.
Figure 2A:
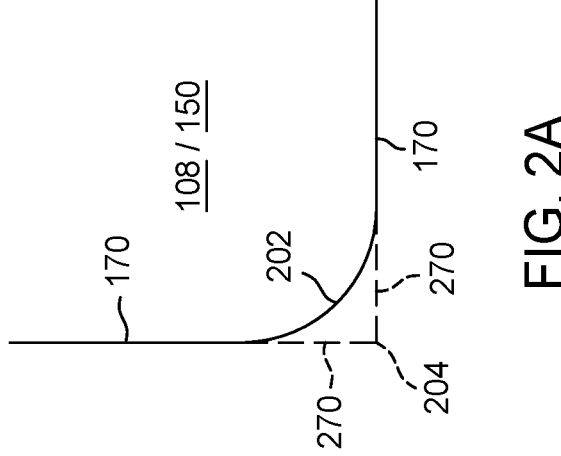

FIGS. 2A-2B are alternative details of a top view of a corner 202 of the package substrate 108 of FIG. 2. As illustrated in FIG. 2A, the edge 170 of the core 144, along with the edge 158 of the outermost dielectric layer 150, may be chamfered so that the corner 202 is recessed from the projected edges 270 meeting at the projected corner 204. As illustrated in FIG. 2B, the edge 158 of the outermost dielectric layer 150 is recessed back from the edge 170 of the core 144. For example, the outermost dielectric layer 150 may be recessed back from the corner 202 to expose one of the underlying interconnect layers 140, such as the dielectric layer 152. In another example, the interconnect layers 140 including outermost dielectric layer 150 are recessed back from the corner 202 to expose the core 144. The outermost dielectric layer 150, and optionally one or more of the other interconnect layers 140 may be recessed back from the corner 202 by mechanically removal (such as milling, laser ablation and grinding, among other mechanical methods), masking during deposition, etching, or other suitable technique.

Other non-limiting examples of one or more locations where the recess between the outer edges 158, 168 of the dielectric layers 150, 160 and the outer edge 170 of the core 144 may be located are shown at sectional lines A-A, B-B, and C-C illustrated in FIG. 2. The recess illustrated through sectional lines A-A, B-B, and C-C may be in addition or alternative of the recess 210 illustrated in the enlargement of FIG. 2, or in FIGS. 2A-2B. Section lines A-A and B-B are disposed through the midpoint of adjacent sides of the package substrate 108, while sectional line C-C is disposed through the corner of the package substrate 108.

Figure 3:
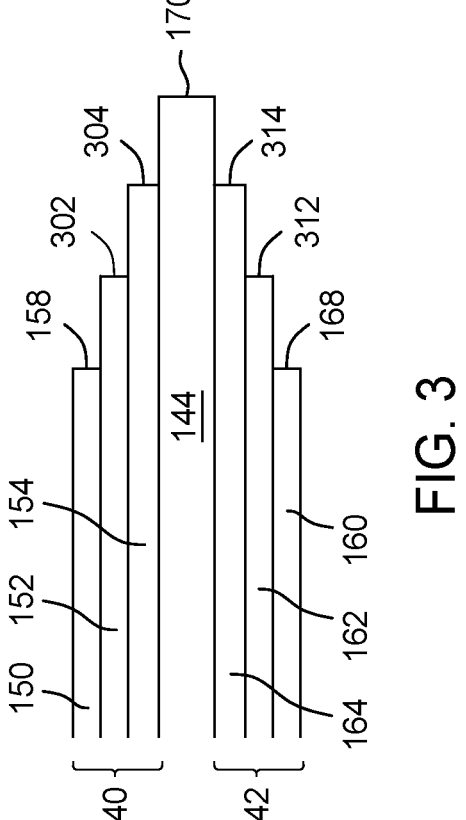
FIGS. 3-6 are partial sectional views of the package substrate taken through one or more of the sectional lines A-A, B-B, and C-C shown in FIG. 2.

FIG. 3 is one example of a partial sectional view of the package substrate 108 taken through one or more of the sectional lines A-A, B-B, and C-C shown in FIG. 2. The configuration of the recess illustrated in FIG. 3 may be present at one or more locations along the periphery of the substrate 108, while other locations may have no recess or one or more other configurations of recesses.

As illustrated in FIG. 3, in addition of the outer edge 158 of the outermost dielectric layer 150, at least one additional dielectric layer 152, 154 of the first plurality of interconnect layers 140 has an edge that is also recessed from the outer edge 170 of the core 144. For example, the dielectric layer 152 has an edge 302 that is recessed from the outer edge 170 of the core 144, and the dielectric layer 154 has an edge 304 that is recessed from the outer edge 170 of the core 144. The edge 304 is recessed a distance from the outer edge 170 that is less than a distance that the edge 302 is recessed from the outer edge 170 of the core 144. Additionally, the distance the edge 302 is recessed from the outer edge 170 that is less than a distance that the edge 158 of the outermost layer 150 is recessed from the outer edge 170 of the core 144. The edges 158, 302, 304 may be recessed by masking during deposition of the layers 140, etching of the layers 140, laser ablation, machining, grinding or other suitable technique. The increase in the distance each edge of the dielectric layer 150, 152, 154 is recessed from the edge 170 creates a taper that reduces the stress on the outermost dielectric layer 150 generated from CTE mismatch with the core 144, making the first plurality of interconnect layers 140 beneficially very resistant to peeling from the core 144, while also beneficially making the core 144 very crack resistant.

Similarly, the dielectric layer 162 has an edge 312 that is recessed from the outer edge 170 of the core 144, and the dielectric layer 164 has an edge 314 that is recessed from the outer edge 170 of the core 144. The edge 314 is recessed a distance from the outer edge 170 that is less than a distance that the edge 312 is recessed from the outer edge 170 of the core 144. Additionally, the distance the edge 312 is recessed from the outer edge 170 that is less than a distance that the edge 168 of the outermost layer 160 is recessed from the outer edge 170 of the core 144. The increase in the distance each edge of the dielectric layer 160, 162, 164 is recessed from the edge 170 creates a taper that reduces the stress on the outermost dielectric layer 160, making the second plurality of interconnect layers 142 beneficially very resistant to peeling from the core 144, while also beneficially making the core 144 very crack resistant.

Figure 4:
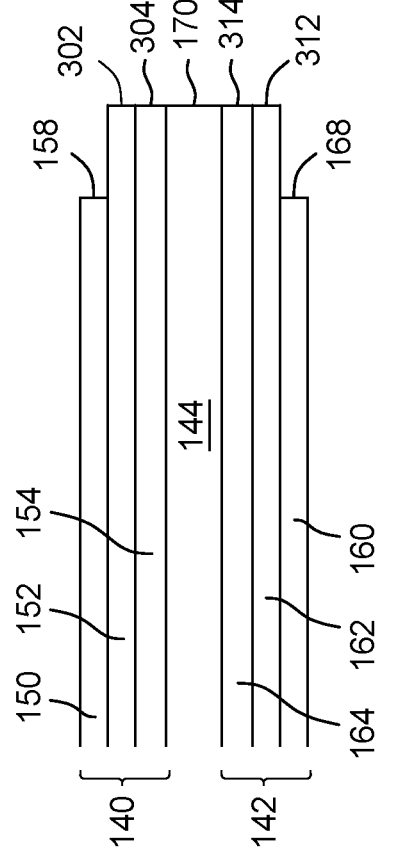

FIG. 4 is another example of a partial sectional view of the package substrate 108 taken through one or more of the sectional lines A-A, B-B, and C-C shown in FIG. 2. The configuration of the recess illustrated in FIG. 4 may be present at one or more locations along the periphery of the substrate 108, while other locations may have no recess or one or more other configurations of recesses.

As illustrated in FIG. 4, only the outer edge 158 of the outermost dielectric layer 150 of the first plurality of interconnect layers 140 is recessed from the outer edge 170 of the core 144. The other dielectric layers 152, 154 of the first plurality of interconnect layers 140 have edges that are not recessed from (i.e., coplanar with) the outer edge 170 of the core 144. The recess of the outer edge 158 of the outermost dielectric layer 150 from the outer edge 170 of the core 144 beneficially reduces the stress on the outermost dielectric layer 150, making the first plurality of interconnect layers 140 very resistant to peeling from the core 144, while also beneficially making the core 144 very crack resistant.

Similarly, only the outer edge 168 of the outermost dielectric layer 160 of the second plurality of interconnect layers 142 is recessed from the outer edge 170 of the core 144. The other dielectric layers 162, 164 of the second plurality of interconnect layers 142 have edges that are not recessed from (i.e., coplanar with) the outer edge 170 of the core 144. The recess of the outer edge 168 of the outermost dielectric layer 160 from the outer edge 170 of the core 144 beneficially reduces the stress on the outermost dielectric layer 160, making the second plurality of interconnect layers 142 very resistant to peeling from the core 144, while also beneficially making the core 144 very crack resistant.

Figure 5:
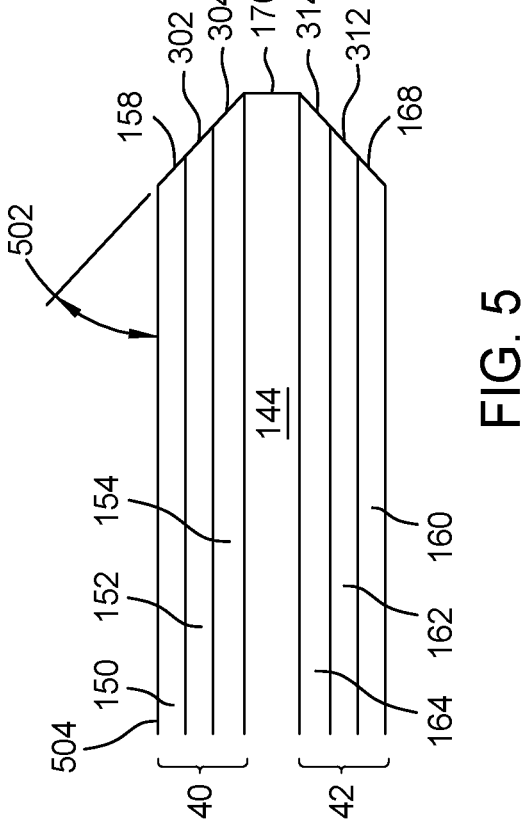

FIG. 5 is another example of a partial sectional view of the package substrate 108 taken through one or more of the sectional lines A-A, B-B, and C-C shown in FIG. 2. The configuration of the recess illustrated in FIG. 5 may be present at one or more locations along the periphery of the substrate 108, while other locations may have no recess or one or more other configurations of recesses.

As illustrated in FIG. 5, the outer edges 158, 302, 304 of the first plurality of interconnect layers 140 are recessed from the outer edge 170 of the core 144. The first plurality of interconnect layers 140 are generally chamfered at the edge of the substrate 108 such that the outer edges 158, 302, 304 form an acute angle 502 with a top surface 504 of the outermost layer 150. In one example angle 502 between 85 and 45 degrees.

In some examples, only the outermost layer 150 is chamfered. In other examples, the outermost layer 150 is chamfered along with one or more of the other layers of the first plurality of interconnect layers 140. In still other embodiments, the outermost layer 150 is chamfered while one or more of the other layers of the first plurality of interconnect layers 140 is recessed from the outer edge 170 of the core 144 in a different manner.

The outer edges 168, 312, 314 of the second plurality of interconnect layers 142 may be similar recessed from the outer edge 170 of the core 144 in the form of a chamfer. The angle of the chamfer of the second plurality of interconnect layers 142 may be the same or different than the angle 502 formed by the outer edges 158, 302, 304 of the first plurality of interconnect layers 140. In other embodiments, the outer edges 168, 312, 314 of the second plurality of interconnect layers 142 may be similar recessed from the outer edge 170 of the core 144 may be configured differently than the first plurality of interconnect layers 140, for example, not having a chamfer.

The chamfer in the first and/or second plurality of interconnect layers 140, 142 may be fabricated by recessed by masking during deposition of the layers, etching of the layers, laser ablation, machining, grinding or other suitable technique. Although not shown, the chamber may extend into the core 144.

Figure 6:
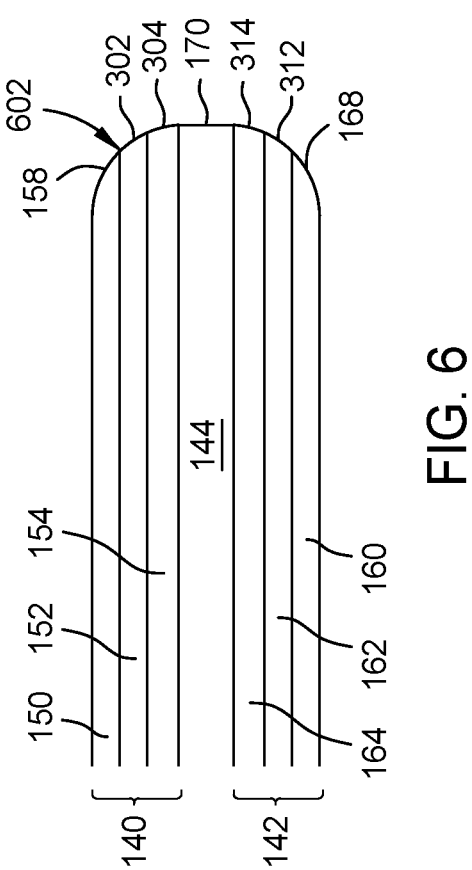

FIG. 6 is another example of a partial sectional view of the package substrate 108 taken through one or more of the sectional lines A-A, B-B, and C-C shown in FIG. 2. The configuration of the recess illustrated in FIG. 6 may be present at one or more locations along the periphery of the substrate 108, while other locations may have no recess or one or more other configurations of recesses.

As illustrated in FIG. 6, the outer edges 158, 302, 304 of the first plurality of interconnect layers 140 are recessed from the outer edge 170 of the core 144 in the form of a radius 602. In some examples, only the outermost layer 150 has the radius 602. In other examples, the outermost layer 150 the radius 602 along with one or more of the other layers of the first plurality of interconnect layers 140. In still other embodiments, at least the outermost layer 150 the radius 602 while one or more of the other layers of the first plurality of interconnect layers 140 is recessed from the outer edge 170 of the core 144 in a different manner.

The outer edges 168, 312, 314 of the second plurality of interconnect layers 142 may be similar recessed from the outer edge 170 of the core 144 in the form of a radius. The radius of the second plurality of interconnect layers 142 may be the same or different than the radius 602 formed in the outer edges 158, 302, 304 of the first plurality of interconnect layers 140. In other embodiments, the outer edges 168, 312, 314 of the second plurality of interconnect layers 142 have a similar or different radius that the radius 602 formed in the first plurality of interconnect layers 140, for example, not having a chamfer.

The radius 602 in the first and/or second plurality of interconnect layers 140, 142 may be fabricated by recessed by masking during deposition of the layers, etching of the layers, laser ablation, machining, grinding or other suitable technique. Although not shown, the radius 602 may extend into the core 144, and in some example, the radius 602 may be a full radius across the thickness of the package substrate 108.

Figures 7, 8:
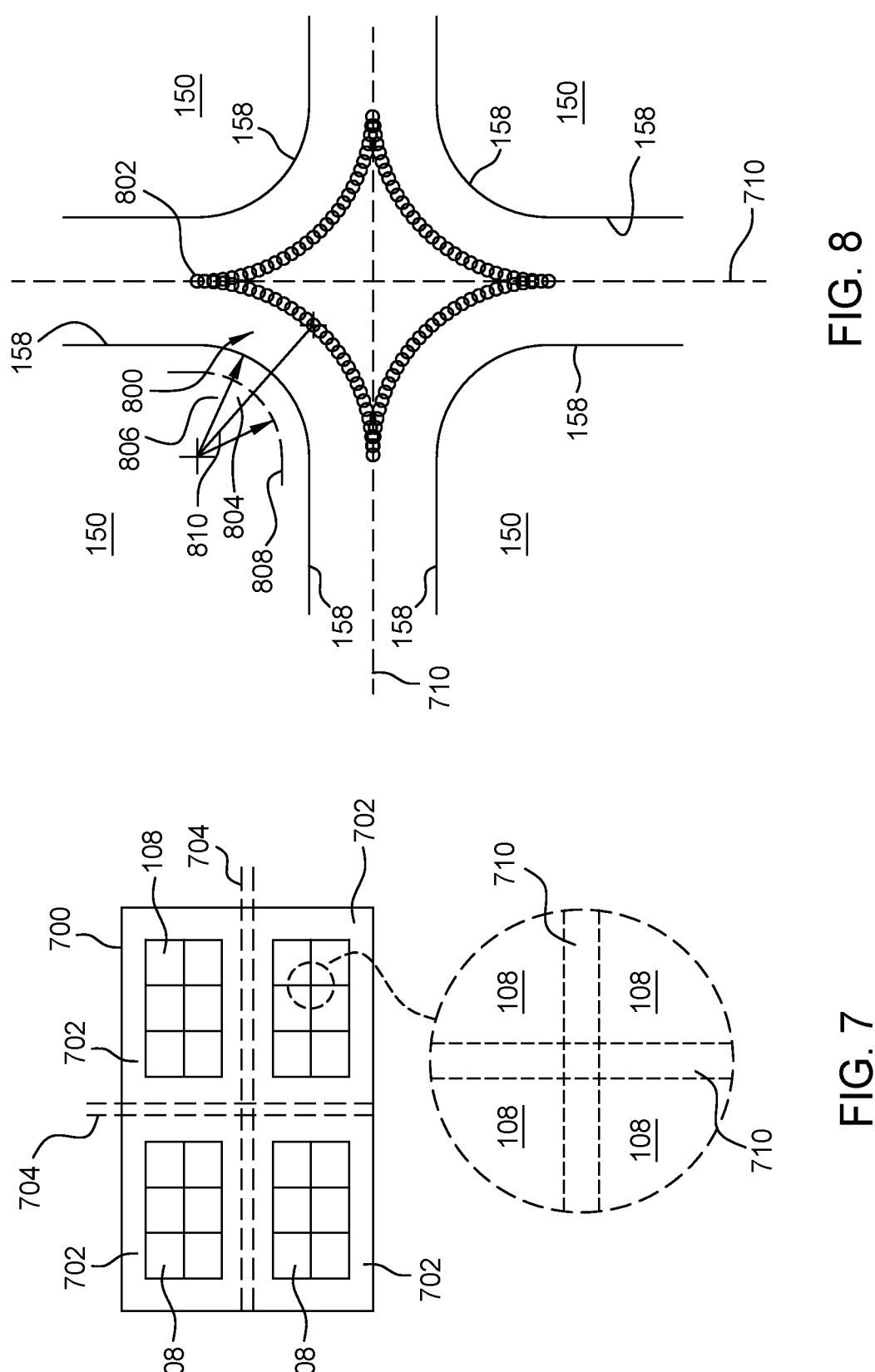
FIG. 7 is a top view of one example of a panel having a plurality of sub-panels from which a plurality of package substrates are fabricated.
FIG. 8 is a partial top view of a portion of a sub-panel at the intersection between 4 adjacent package substrates.

FIG. 7 depicts a panel 700 upon which a plurality of package substrates 108 may be fabricated. The panel 700 generally includes the core 144 upon which the interconnect layers 140, 142 are deposited and patterned to form the circuitry through the package substrates 108.

The package substrates 108 are generally formed in a plurality of groups that are spaced apart by saw lanes. In FIG. 7, orthogonal saw lanes 704 are illustrated that are utilized to separate the panel 700 into separate sub-panels 702. Each sub-panels 702 include a plurality of the package substrates 108 (i.e., a group of package substrates 108). The number of sub-panels 702 and the number of package substrates 108 within each sub-panel 702 illustrated in FIG. 7 are simply for convenience, and any number of number of sub-panels 702 and the number of package substrates 108 within each sub-panel 702 may be utilized as desired as space permits.

In the enlargement depicted in FIG. 7, scribe lanes 710 are shown separating each of the package substrates 108 within the sub-panel 702. After the sub-panels 702 are separated by cutting the panel 700 along the saw lanes 704, the individual package substrates 108 are separated by dicing the sub-panels 702 along the scribe lanes 710 to singulate the individual package substrates 108.

FIG. 8 depicts a partial top view of a portion of sub-panel 702 at the intersection between four adjacent package sub-strates 108. An arc-shaped slot 800 is formed through the panel 700 at the corner of each package substrate 108. The arc-shaped slot 800 of one package substrate 108 generally intersects the arc-shaped slot 800 of the adjacent package substrate 108 at the scribe lane 710. The arc-shaped slot 800 may be made prior or after separation of the sub-panels 702. When the package substrates 108 are singulated, the saw cutting the sub-panels 702 along the scribe lanes 710 to form the edges 170 of the substrate 108 intersect with the slots 800 such that the substrate side of the slot 800 forms the corner 202 of the package substrate 108.

The scribe lanes 710 are generally wider that convention scribe lanes to accommodate fabrication of the arc-shaped slot 800 without damaging the other adjacent substrates 108. In one example, the scribe lanes 710 are at least 5 mm wide.

The arc-shaped slot 800 may be made by machining, drilling, etching, laser ablation, or other suitable technique. In the example depicted in FIG. 8 is fabricated by drilling a plurality of holes 802 through the panel 700. Each hole 802 forming a portion of one of the arc-shaped slots 800 overlaps the neighboring hole 802 forming the common slot 800. The center of the holes 802 may lie on a common radius 804. For example, a plurality of holes 802 are formed through the core 144 along an arc having a radius 804. The radius 804 may be about 0.25 mm to about 2 mm, such as about 0.5 mm, or about 1 mm. In another example, the radius 804 is about 0.75 mm to about 1.5 mm, such as about 1 mm or about 1.25 mm.

The radius 804 may have a common origin with a radius 806 of the edge 158 of the outermost dielectric layer 150, such as the solder mask. It has been demonstrated that a radius 804 of 1.0 mm or larger significantly reduces the stress at the corner 202, which reduce the propensity for the core 144 to crack. Further, an edge 808 of the metal layers comprising the first interconnect layers 140 may be disposed at a radius 810 which is smaller than the radius 806 of the edge 158 of the outermost dielectric layer 150, which beneficially further assists in reducing thermally induced stress within the package substrate 108.

Generally the edge 158 of the outermost dielectric layer 150 is sufficiently offset from the scribe lane 710 so that the outermost dielectric layer 150 is not damage or cut when the package substrates 108 are signulated by cutting the sub-panel 702 along the scribe lane 710. By keeping the edge 158 of the outermost dielectric layer 150 way from the dicing saw when separating the package substrates 108 along the scribe lane 710, the integrity of the outermost dielectric layer 150 is maintained while enhancing the resistance of the core 144 to cracking, which beneficially promotes longer service life.

Figure 9:
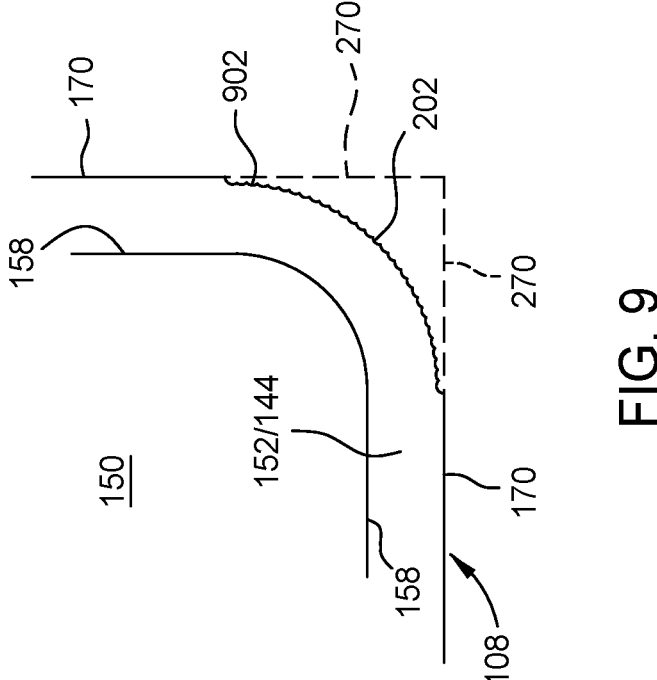
FIG. 9 is a partial top view of a corner of a package substrate illustrating scallops formed in an arc-shaped slot.

After singulation, the corner 202 of the package substrate 108 has a curve that is recessed from the projected edge 270 as discussed above. When fabricating the corner 202 as described above using a plurality of overlapped holes 802, the edge 170 of the core 144 (and package substrate 108) will include a plurality of scallops 902, as illustrated in FIG. 9. If desired, the scallops 902 may be removed by grinding or other suitable method.

In one example, the recess of the edge 158 is between about 300 micrometers and about 100 micrometers, such as about 125 micrometers. In another example, the recess of the edge 158 is between about 150 micrometers and about 250 micrometers, such as about 175 micrometers. In another example, the recess of the edge 158 is between about 155 micrometers and about 225 micrometers, such as about 200 micrometers.

Thus, disclosed herein is an improved package substrate, and a method for fabricating the same. Advantageously, the package substrate and method of fabricating the same reduce stress between the interconnect layers and the core, and within the core itself. Thus, a reduction in the occurrence of cracks and peeling between the interconnect layers and the core of the package substrate, along with a reduction in the risk of core cracking is realized. While the foregoing is directed to specific examples, other examples may be devised without departing from the basic scope thereof, and the scope thereof is determined by the claims that follow.

What we claim is:

1. A package substrate comprising:
a core having an outer edge and containing no IC dies; and
a first plurality of interconnect layers disposed on the core and forming at least a portion of the package substrate, wherein at least two of the first plurality of interconnect layers have edges that are progressively recessed from the outer edge of the core to define a stairstep profile constructed during buildup of the first plurality of interconnect layers, the first plurality of interconnect layers disposed on the core including an outermost dielectric layer disposed farthest from the core, the outermost dielectric layer having an edge that is recessed from the edge of the core, wherein the first plurality of interconnect layers further comprises:
an underlying dielectric layer disposed between the outermost dielectric layer and the core, the underlying dielectric layer having an edge that is disposed between the edge of the core and the edge of the outermost dielectric layer; and
a second plurality of interconnect layers disposed on a side of the core opposite the first plurality of interconnect layers, wherein at least two of the second plurality of interconnect layers have edges that are progressively recessed from the outer edge of the core to define a complementary stairstep profile constructed during buildup of the second plurality of interconnect layers.

2. The package substrate of claim 1, wherein the outer edge of the core forms an arc at a corner of the package substrate.

3. The package substrate of claim 2, wherein the edge of the outermost dielectric layer is recessed from the outer edge of the core at the corner of the package substrate.

4. The package substrate of claim 2, wherein the arc includes a plurality of scallops having an orientation substantially perpendicular to a plane of the core.

5. The package substrate of claim 1, wherein at least two dielectric layers of the first plurality of interconnect layers are recessed from the edge of the core.

6. The package substrate of claim 1, wherein one or more of the first plurality of interconnect layers has a chamfered edge.

7. The package substrate of claim 1, wherein one or more of the first plurality of interconnect layers has a radiused edge.

8. The package substrate of claim 1, wherein the recess is at a midpoint of a side of the package substrate.

9. The package substrate of claim 1, wherein the recess is along adjacent sides of the package substrate.

10. The package substrate of claim 1 wherein the second plurality of interconnect layers are equal in number to the first plurality of interconnect layers.

11. The package substrate of claim 1, wherein edges of the underlying dielectric layer form an acute angle with a top surface of the outermost dielectric layer.

12. The package substrate of claim 1, wherein edges of the underlying dielectric layer form a radius.

13. An integrated circuit device comprising:
an IC die having solid state circuitry; and
a package substrate comprising:
a core having an outer edge and a plurality of vias and containing no IC dies; and
a first plurality of interconnect layers disposed on the core and forming at least a portion of the package substrate, wherein at least two of the first plurality of interconnect layers have edges that are progressively recessed from the outer edge of the core to define a stairstep profile constructed during buildup of the first plurality of interconnect layers, the first plurality of interconnect layers including routings that electrically couple the plurality of vias of the core to the solid state circuitry of the IC die, the first plurality of interconnect layers disposed on the core including an outermost dielectric layer disposed farthest from the core and having the IC die communicatively and mechanically coupled thereto, the outermost dielectric layer having an edge that is recessed from the edge of the core, wherein the first plurality of interconnect layers further comprises:

an underlying dielectric layer disposed between the outermost dielectric layer and the core, the underlying dielectric layer having an edge that is disposed between the edge of the core and the edge of the outermost dielectric layer; and a second plurality of interconnect layers disposed on a side of the core opposite the first plurality of interconnect layers, wherein at least two of the second plurality of interconnect layers have edges that are progressively recessed from the outer edge of the core to define a complementary stairstep profile constructed during buildup of the second plurality of interconnect layers.

14. The integrated circuit device of claim 13, wherein the outer edge of the core forms an arc at a corner of the package substrate.

15. The integrated circuit device of claim 14, wherein the edge of the outermost dielectric layer is recessed from the outer edge of the core at the corner of the package substrate.

16. The integrated circuit device of claim 14, wherein the arc includes a plurality of scallops having an orientation substantially perpendicular to a plane of the core.

17. The integrated circuit device of claim 13, wherein at least two dielectric layers of the first plurality of interconnect layers are recessed from the edge of the core.

18. The integrated circuit device of claim 13, wherein one or more of the first plurality of interconnect layers has a chamfered edge.

19. The integrated circuit device of claim 13, wherein one or more of the first plurality of interconnect layers has a radiused edge.

20. The package substrate of claim 13, wherein edges of the underlying dielectric layer form an acute angle with a top surface of the outermost dielectric layer or form a radius.

* * * * *